United States Patent [19]

Roche

[11] 4,160,683
[45] Jul. 10, 1979

[54] METHOD OF MANUFACTURING FIELD EFFECT TRANSISTORS OF THE MOS-TYPE

[75] Inventor: Marcel Roche, Paris, France

[73] Assignee: Thomson-CSF, Paris, France

[21] Appl. No.: 897,169

[22] Filed: Apr. 17, 1978

[30] Foreign Application Priority Data

Apr. 20, 1977 [FR] France ................................ 77 11912

[51] Int. Cl.² ............................................ H01L 21/225
[52] U.S. Cl. ................................... 148/187; 148/1.5;
148/188; 29/571; 357/23
[58] Field of Search ................. 148/187, 188, 1.5, 33;
156/633; 29/571; 357/23, 65

[56] References Cited

U.S. PATENT DOCUMENTS

| 3,334,281 | 8/1967 | Ditrick | 148/187 X |
| 3,434,021 | 3/1969 | Hofstein | 148/188 X |
| 3,658,610 | 4/1972 | Arita et al. | 148/1.5 X |
| 3,837,071 | 9/1974 | Ronen | 29/571 |
| 3,959,025 | 5/1976 | Polinsky | 148/187 X |

Primary Examiner—G. Ozaki
Attorney, Agent, or Firm—Cushman, Darby & Cushman

[57] ABSTRACT

A method for producing field-effect transistors of the insulated-grid MOS-type, with a precise positioning of the gate in relation to the source and drain regions, providing for the preliminary formation of these regions (43) and (44) by diffusion from portions of doped silica, such as (70), these portions subsequently being used as masks for forming the gate (45) and establishing its external connection (72).

5 Claims, 2 Drawing Figures

METHOD OF MANUFACTURING FIELD EFFECT TRANSISTORS OF THE MOS-TYPE

This invention relates to solid-state devices of the type known as insulated-gate field-effect transistors. In devices of this kind, a channel capable of conducting electrical charges is formed on one main surface of semiconductor block, being connected at one end to an input or "source" electrode and at its other end to an output or "drain" electrode.

The quantities of charges capable of passing from the source to the drain along the channel is controlled by the effect of a transverse electrical field which is created in the channel by a lateral electrode insulated therefrom, known as the control gate, insulation being effected by a layer of a dielectric material, such as silica.

The performances of transistors of this type which, by virtue of their structure and their mode of operation, are often referred to by the initials MOSFET (Metal-Oxide-Semiconductor-Field-Effect-Transistor) depends largely upon the precision of their geometry and, above all, upon the precision with which the channel is positioned relative to the source and drain regions. This need for precision is further increased in cases where it is desired to extend operation towards the range of high frequencies, in which case the length of the channel amounts to only a few micrometers in view of the desire to reduce residual capacitances.

For the high-precision manufacture of transistors of the type in question, in which, as already mentioned, the gate disposed laterally of the channel extends over virtually the entire length of the channel, methods or processes have been proposed, as will be explained in detail hereinafter, in which the various regions of conductivity adjacent the channel are formed by using the grid, deposited beforehand, as a physical or chemical masking element. Although the required precision can be obtained in this way, it will be shown hereinafter that these processes are attended by a number of disadvantages which limit their performances when it comes to operation at high frequencies by the troublesome introduction of an excessive electrical resistance, which is a source of parasitic noise, either into the channel or into the gate.

The method of manufacturing a MOSFET according to the present invention is not attended by any of these disadvantages.

Whilst providing for extremely precise positioning of the various active regions of the transistor, it enables a very low resistance to be maintained in the gate and in the channel with an almost negligible parasitic gate capacitance.

In principle, the method according to the invention does not use the gate as a masking element for defining the source and drain regions which are adjacent to it, but instead forms these regions with precision beforehand, the gate being deposited on completion of production. One of the fundamental characteristics of the invention is that it narrowly limits the outer region of contact of the gate by defining it by a physicochemical cutting operation on a circular acute-angled piece of silica which surrounds that region.

According to another aspect of the invention, this acute-angled circular piece of silica is obtained by particular chemical etching of the layer of silica associated with a progressive inclusion of atoms of a doping impurity in that layer throughout its thickness.

More precisely, the invention relates to a method of manufacturing field effect transistors of the MOS-type on one main surface of a substrate of monocrystalline semiconductor material of a first conductivity type, comprising on the one hand two regions of a conductivity type opposite to the first conductivity type, namely a source region and a drain region, respectively, terminating at said surface and separated by an intermediate channel region of the substrate, and on the other hand a control gate of an electrically conductive material extending above said intermediate region, from which it is insulated by a layer of dielectric material, said process being characterised in that it comprises the following steps:

forming a masking layer of silica on the principal surface of the substrate and forming two openings to expose two zones;

diffusing impurities having the second conductivity type through these openings to form the source and drain regions;

removing that portion of the silica masking layer which is present on said intermediate region and forming by successive deposits over the entire principal surface a layer of doped silica containing a doping impurity of the second conductivity type, the doping level decreasing with each successive deposit;

removing said layer of doped silica by chemical etching, except for two portions situated on the intermediate region respectively adjacent the source and drain regions;

diffusing impurities from said two portions into the substrate by heating to a temperature of from 950 to 1150 degrees C., to create therein two regions defining the ends of the channel; during or after this diffusion, forming a layer of dielectric material on the exposed zones of the principal surface;

forming a layer of conductive metal over the entire principal surface; and removing those portions of said metal layer which are situated above the portions of the layer of doped silica present on said two defining regions by chemical etching to obtain source, gate and drain contacts, respectively.

The invention will be better understood from the following description in conjunction with the accompanying drawings, wherein:

FIG. 1 shows the succession of principal steps involved in the production of a MOSFET by a known process.

Figure 1:
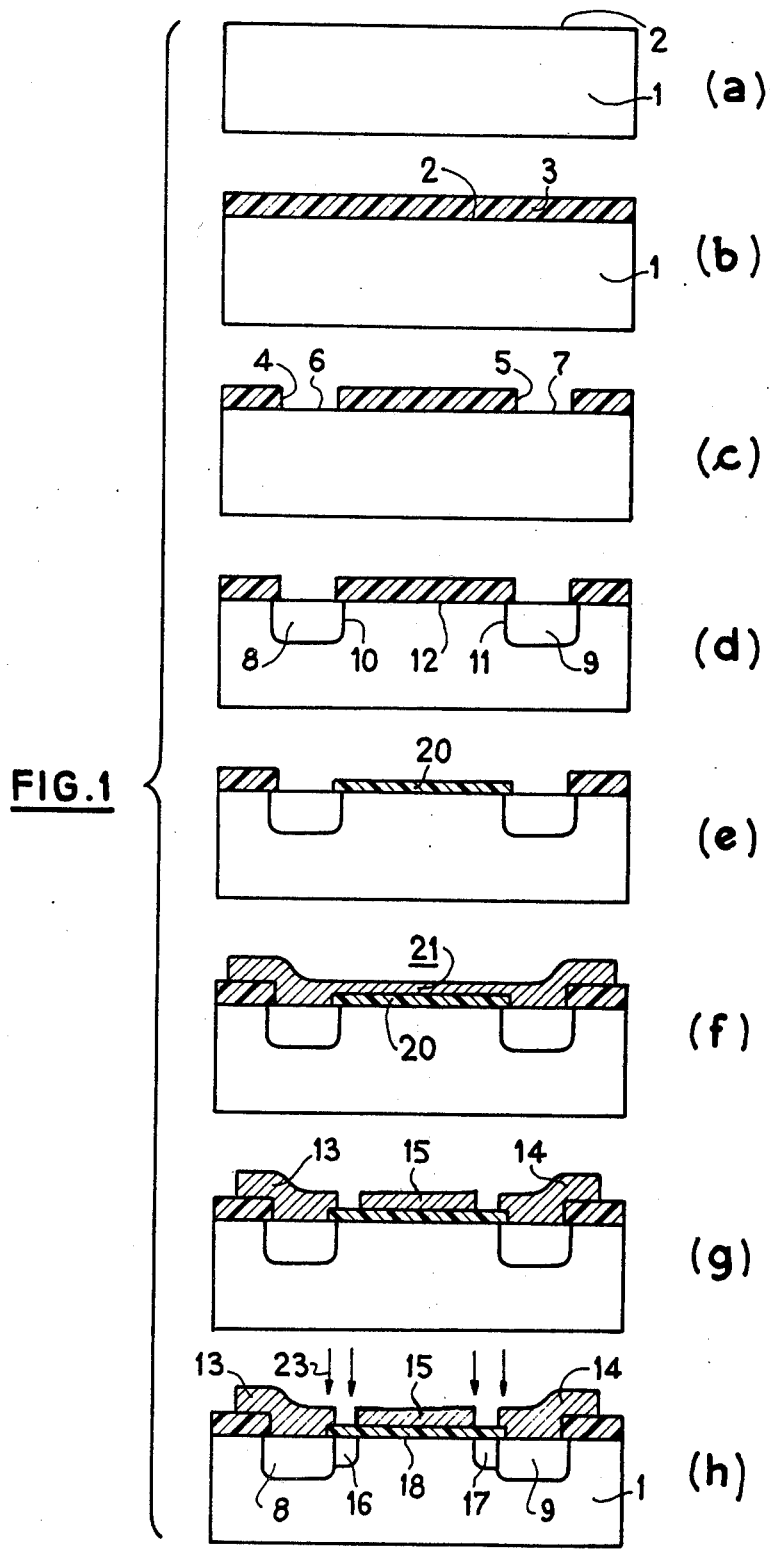
FIG. 1 shows, in the form of sections, the succession of steps involved in the production of a MOSFET transistor by a known process.

Starting at (a) with a silicon substrate 1, a continuous layer of silicon oxide, $SiO_2$, or silica 3 is grown at (b) by thermal oxidation on one principal surface 2 of the silicon substrate 1.

This layer has a thickness of, for example, 5000 Å. Openings 4 and 5 are formed as shown in (C) by masking with photosensitive resins and chemical etching to expose zones 6 and 7 of the substrate.

A diffusion of impurities with a conductivity type opposite to that of the substrate is made through the openings, leading at (d) to regions 8 and 9 delimited by junctions 10 and 11, i.e. the source region and drain region, respectively.

The zone 12 is intended to form the region of the channel and the gate, but the oxide covering is soiled and, in addition, is too thick to allow the gate electrical field phenomenon to occur. Accordingly, it is removed and a separate layer 20 of silica is deposited at (e) in a thickness of the order of 0.1 micrometer.

The source and drain contacts and the gate electrode are then formed.

The conductive material selected is aluminum. A continuous layer 21 is deposited at (f) over the entire principal surface of the substrate, after which the source and drain contacts 13 and 14 and the gate 15 are defined at (g) by chemical etching under a photomask.

The final step in the definition of the channel has now been reached, using the presence of the gate 15 which forms a mask eminently suitable for the required definition, the length of the channel having to be defined with precision by two regions adjacent the gate and connected to the source and to the drain.

These regions are formed by ion bombardment with suitable impurities having the same conductivity type as the source and drain regions (this technique is known as ion implantation) in an orientation and direction as indicated by the arrows 23 in (h). The presence of the gate 15 forms a mask which limits the diffusion of the impurities thus implanted in the regions 16 and 17.

It follows from this that the region 18 situated below the gate is delimited with precision and that the channel included therein is thus defined with the same precision.

However, this process is attended by one serious disadvantage associated with the use of ion implantation. This is because, after implantation, the crystal lattice of the silicon is disturbed and has to be regenerated by heat treatment. However, the temperature at which the heat treatment is carried out has to be kept at a value below that of the aluminum-silicon eutectic. The result of this is that regeneration is incomplete and the mobility of the carriers remains low on account of the presence of complex faults in the lattice, which ultimately results in a significant parasitic channel resistance and in a troublesome source of noise in the transistor.

The replacement of aluminum by refractory metals which are able to withstand heat treatment at a higher temperature has not been successful on account of the technological complications involved.

By contrast, it has successfully been proposed to use a gate of semiconductor material, such as doped polycrystalline silicon, which enables the source and the drain to be formed relative to the gate by implantation through the oxide, as already described, or even by diffusion after removal of the oxide, the polycrystalline gate serving as a mask for these two operations. However, although this technology is eminently suitable for the production of medium-performance MOSFETS, it is unfortunately incompatible with the formation of fast elements capable of operating at frequencies above 500 MHz. This is because the gate resistance introduced by the polycrystal line silicon represents a significant part of the input impedance which is reflected in a reduction in gain and an increase in the noise factor at high frequencies.

Figure 2:
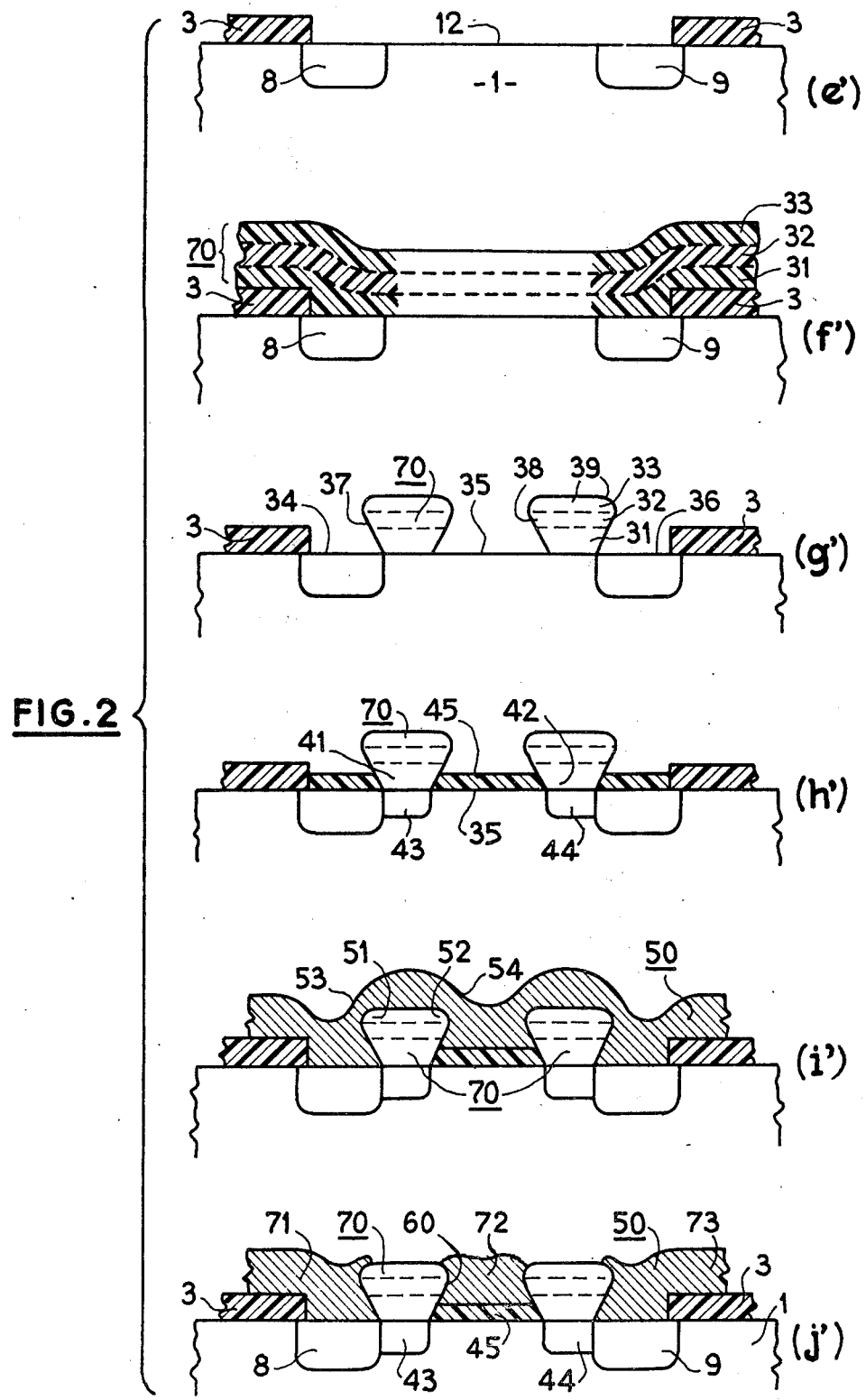
FIG. 2 shows, in the form of sections, the succession of steps involved in the production of a MOSFET transistor by the process according to the invention.

FIG. 2 shows the principal steps of the process according to the invention in the form of sectional views.

In the interests of simplicity, the first steps have not been shown because they are the same as steps (a) to (d) described and illustrated for the known process of FIG. 1. A substrate coated with thermal oxide or silica is obtained in step (d), comprising a source region and a drain region of opposite conductivity type to its own.

According to the invention, after the thermal silica has been completely removed by chemical etching in step (e') from that part 12 of the principal surface which is situated within the source-drain surface, several layers of silica such as 31, 32 . . . 33 are deposited, each layer being distinguished from the preceding layer by the addition of "doping" level of an impurity having the same conductivity type as the source and drain regions.

The first layer 31 is heavily doped whilst the following layers are doped to increasingly lower levels; the last layer is not doped. By way of typical order of magnitude, the total thickness of the silica layer thus obtained is approximately 1 micrometer and the doping level of the first layer may amount to between 2% and 10% by weight. The process by which the successive layers are deposited is based on the pyrolytic decomposition of a silicon compound in the vapor phase, such as the silane $SiH_4$, in an oxidizing atmosphere in the presence of a substance containing the selected doping impurity having an opposite conductivity type to the substrate. This substance may be N-type phosphorus or P-type boron, as required.

On completion of the step, the stage shown in FIG. 2 (f') is obtained, being characterised by a composite layer of silica 70 having a doping gradient.

In practice, the layer of silica is deposited with a substantially continuous variation in the doping level.

It is now necessary to form in the layer 70 the openings required for forming the source and drain contact zones and the gate zone. It is in the step shown at (g') where the zones of the substrate 34, 35 and 36 are exposed by photomasking and chemical etching.

However, one of the features of the invention appears in this step, namely the overhanging form of the openings 37, 38 and 39 which results from irregular chemical etching during their formation due to the fact that the etching rate of the chemical reactant used is greater, the higher the doping level of the silica, which accounts for the desire to obtain the profile illustrated in the FIG. 2(g').

The following step, shown at 2(h'), consists in delimitation of the length of the channel. According to the invention, this delimitation is particularly simple and precise because it consists in a thermal treatment at a temperature sufficient to obtain, from the layer 70 of doped silica, a diffusion of doping impurities into the substrate forming two regions 43 and 44 adjacent the source and drain delimiting the channel.

During or after this diffusion step, the zone 35 is subjected to thermal oxidation over its surface to determine the formation of a suitable thick layer of silica 45 insulating the gate.

It is important to observe that the layer of silica insulating the grid relative to the two regions 43 and 44 delimiting the channel is thus obtained automatically and with considerable precision by a self-aligning effect.

The benefit of a self-aligning effect such as this is again obtained in the following step (i') in which the gate is formed.

To this end, a layer 50 of metal, such as aluminum, to which a certain quantity of silicon, for example of the order of 1.5%, may optionally be added, is deposited over the entire principal surface of the substrate.

The form of the openings or "pits" in the doped silica, for which the reason was explained above, produces in the zones such as 51 and 52 local reductions in thickness, such as 53 and 54, of which the significance will be explained hereinafter.

Finally, in step (j'), the redundant parts of the metal layer are removed by chemical etching under a photomask leaving contacts 71, 72 and 73. The mask protecting the gate is with advantage slightly wider than the opening in the silica to allow for positioning errors before etching; the degree of overlap is typically of the order of a few micrometers. The gate electrode, of which the active part is situated at the bottom of the "pit" 60, is completely protected during the etching process. By contrast, the upper parts of the metallic layer, which could normally have regions overlapping the surface of the layer 70 of silica, are removed with precision at the level of the acute angle of the circumference, such as at 51, in the manner of a tool of the "punch" type, by virtue of the local reduction in thickness which they show around the orifice of the gate pit. The parasitic electrical capacitance of the gate electrode due to the usual overlap of the gate contact is completely eliminated in the process according to the invention.

The process according to the invention is even more effective where chemical etching is accompanied by the application of ultrasound.

In addition, it should be noted that, where the upper part of the gate contact is left with a slight overlap, the considerable thickness of the doped oxide minimises any parasitic capacitance.

Finally, it should be noted that, in relation to the conventional process, elimination of the need for ion implantation provides for considerable freedom in the choice of the gate metal and respects the original crystal lattice whilst, at the same time, providing for high precision in the positioning of the channel region of the MOSFET transistor.

According to the numerical data supplied by way of example, a transistor of the MOSFET type produced by the method according to the invention, by comparison with a transistor produced by previously known processes, showed an improvement of 3dB in the signal-to-noise ratio in the case of operation at a frequency of 800 MHz.

What is claimed:

1. A method of manufacturing field-effect transistor of the MOS-type in one principal surface of a substrate of monocrystalline semiconductor material having a first conductivity type, comprising on the one hand two regions having a second conductivity type opposite to the first, namely a source region and a drain region, respectively, terminating at said surface and separated from one another by an intermediate channel region of the substrate and, on the other hand, a control gate of an electrically conductive material extending above said intermediate region, from which it is insulated by a layer of dielectric material, said method comprising the following steps:

forming a masking layer of silica on the principal surface of the substrate (1) and forming two openings to expose two zones;

diffusing impurities having the second conductivity type through these openings to form a source region (8) and a drain region (9);

removing that portion of the masking silica layer which is present on said intermediate region (12) and forming, by successive deposits over the entire principal surface, a layer (70) of doped silica containing a doping impurity of the second conductivity type, the doping level decreasing with each successive deposit;

removing said layer of doped silica by chemical etching except for two portions situated on the intermediate region respectively adjacent the source and drain regions, said portions decreasing in section in the direction toward said substrate to form a pit;

diffusing impurities into the substrate from said two portions by heating to a temperature of from 950° C. to 1150° C. to form therein two regions (43) and (44) defining the ends of the channel;

forming a layer of dielectric material (45) on the exposed zones of the principal surface during or after this diffusion;

forming a layer (50) of conductive metal over the entire principal surface, said layer having reductions in thickness around said portions; and removing those portions of said metal layer which are situated above the portions of the layer of doped silica present on said two defining regions (43) and (44) by chemical etching to form source, gate and drain contacts (71), (72), and (73), respectively.

2. A method as claimed in claim 1, wherein said dielectric material is silica.

3. A method as claimed in claim 1, wherein said semiconductor material is silicon.

4. A method as claimed in claim 3, wherein said masking layer of silica is formed by thermal oxidation of the principal surface of the substrate.

5. A method as claimed in claim 1, wherein that said conductive metal is aluminum.

* * * * *